United States Patent [19]

Hitch

[11] 4,207,138
[45] Jun. 10, 1980

[54] MERCURY VAPOR LEACHING FROM MICROELECTRONIC SUBSTRATES

[75] Inventor: Thomas T. Hitch, Lawrenceville, N.J.

[73] Assignee: RCA Corporation, New York, N.Y.

[21] Appl. No.: 4,177

[22] Filed: Jan. 17, 1979

[51] Int. Cl.² .............................................. C23F 1/00
[52] U.S. Cl. ...................................... 156/642; 75/83; 156/646; 156/656; 156/664; 252/79.1
[58] Field of Search ............... 156/642, 646, 665, 656, 156/635; 252/79.1; 75/83

[56] References Cited

U.S. PATENT DOCUMENTS

| | | | |
|---|---|---|---|
| 144,772 | 11/1873 | Kirk | 75/83 |
| 145,265 | 12/1873 | Wiegand | 75/83 |
| 168,695 | 10/1875 | Wiegand | 75/83 |
| 219,132 | 9/1879 | Wiegand | 75/83 |
| 3,162,104 | 12/1964 | Medley | 156/642 |
| 3,257,246 | 6/1966 | Grosvalet et al. | 156/646 |
| 3,494,768 | 2/1970 | Schaefer | 156/635 |
| 3,518,115 | 6/1970 | Pammer et al. | 156/646 |
| 3,923,569 | 12/1975 | Ono et al. | 156/646 |

OTHER PUBLICATIONS

Hitch, "Phase Morphology . . . Inks," presented at 1971, International Microelectronic Symposium, Oct. 11-13, 1971, Chicago, Ill.
Hitch, "Adhesion, . . . Conductors," Journal of Elec. Materials, vol. 3, No. 2 (1974), pp. 553-577.

*Primary Examiner*—Jerome W. Massie
*Attorney, Agent, or Firm*—Birgit E. Morris; A. Stephen Zavell

[57] ABSTRACT

A method for leaching mercury soluble metals from mercury insoluble substrates such as microelectronic devices without damaging the substrate or contaminating the environment with mercury. A mercury vapor jet is formed by passing mercury vapors through an orifice at residual gas pressure of about $10^{-2}$ Torr and a temperature of from about 65° C. to about 150° C. The mercury vapor jet strikes the substrate at an angle which is substantially perpendicular to the center of the substrate and leaches the mercury soluble metal therefrom.

10 Claims, 4 Drawing Figures

MERCURY VAPOR LEACHING FROM MICROELECTRONIC SUBSTRATES

This invention relates to a method of dissolving metals from metallic and non-metallic substrates. More particularly, this invention relates to a method of vapor leaching of a metal from a microelectronic substrate.

BACKGROUND OF THE INVENTION

Thin and/or thick film conductor inks, incorporating metals such as gold, copper, silver and the like, are applied as contacts on microelectronic devices. A conductor ink is a mixture of extremely fine particles of metal and glass dispersed in organic and inorganic carriers. Upon firing of the conductor ink, the volatile carrier evaporates and a metal contact incorporating glass is deposited on the microelectronic substrate. To prevent premature device failure, the conductor ink must be fired within a limited temperature range to insure proper bonding of the contact to the metallic or non-metallic substrate. To determine the proper firing temperature, the conductor ink has to be removed from the substrate without damaging the substrate. Scribing and breaking the substrate at the point of adhesion followed by viewing the substrate under a scanning electronic microscope (SEM) is a known method to determine the adhesion of the metal. However, this method is not always possible and may damage the structure of the glass binder layer of the contact on the substrate.

Thus, a method and apparatus which can leach the contacting metal out of the fired conductor ink and away from the metallic or non-metallic substrate to reveal the interface (binder layer to metal phase) microstructure would be highly desirable.

SUMMARY OF THE INVENTION

I have invented a mercury vapor leaching method and apparatus for removing metals which are soluble in mercury from mercury insoluble substrates. The method comprises reducing the pressure in the leaching apparatus to about $10^{-2}$ Torr or lower and contacting a mercury insoluble substrate containing the metal to be leached with a mercury vapor jet at a temperature of at least about 65° C. to about 150° C., said mercury vapor jet having an expansion in width of less than about 4 mm per centimeter of distance traveled, at an angle which is substantially perpendicular to the center of said substrate for a time sufficient to dissolve said mercury soluble metal.

DETAILED DESCRIPTION OF THE INVENTION

Figure 1:
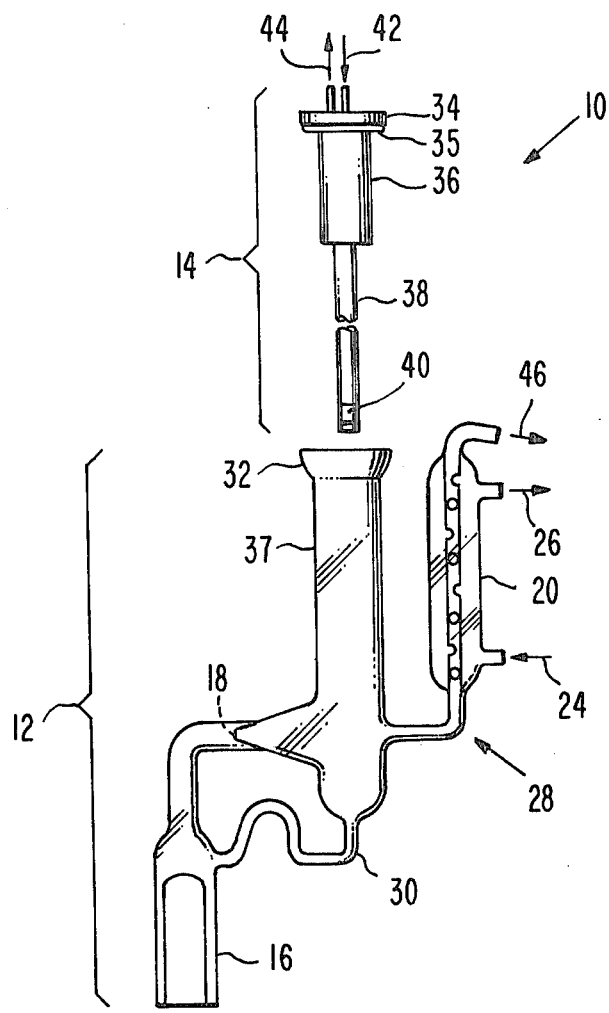
FIG. 1 is a cross-sectional view of an apparatus for carrying out the method according to my invention.

The invention will be more clearly illustrated by referring to FIG. 1 which depicts a vapor mercury leaching apparatus 10. Apparatus 10 comprises a glass shell 12, which is made of pyrex TM or other glasses with low thermal expansion and heat resistant properties or other suitable materials, and a water-cooled substrate holder 14, made of welded stainless steel or other suitable material. The water-cooled substrate holder 14 is inserted into the glass shell 12 during mercury vapor leaching of a substrate.

The shell 12 includes a hollow-bottom boiler 16 which heats mercury to form a vapor which is passed through an orifice 18 to form a mercury vapor jet. The mercury vapor jet strikes the substrate 40 at an angle which is substantially perpendicular with respect to the center of the jet. The mercury vapor jet leaches the desired metal therefrom when substrate holder 14 is inserted into the shell 12 during the operation of apparatus 10. Placement of the boiler 16 directly below the substrate 40 caused mercury to coat the inside of the shell 12 and prevented an accurate determination of the progress of the leaching or the end point of a reaction. In addition, the boiling mercury has a tendency to bump and splatter which creates containment and contamination problems which are solved by the narrow width and directed nature of the mercury vapor jet from orifice 18. The hollow-bottom boiler 16 should have sufficient power to provide a mercury vapor jet temperature, measured just prior to the mercury jet striking the substrate, of at least 65° C. to about 150° C. and preferably 100° C. to about 125° C.

The size of the orifice 18 depends upon the size of the apparatus and the volume of mercury which passes through the orifice 18. An orifice size of about 5 mm is sufficient in an apparatus large enough to process microelectronic substrates with an area of about 3 cm². In addition, the orifice size should be selected such that the expansion of the mercury vapor jet from the orifice to the substrate is less than about 4.0 mm per centimeter traveled from the orifice and preferably less than about 2.5 mm/cm. A mercury vapor jet is defined as a stream of mercury vapor wherein the expansion of the width of said stream is less than about 0.40 centimeter per centimeter traveled. Preferably the expansion of the mercury vapor jet is less than about 0.25 cm. For example, with an orifice size of about 5 mm and a distance of about 10 centimeters from the orifice to the substrate, the mercury vapor jet should not expand more than about 3 centimeters.

The portion of the mercury vapor jet which does not strike the substrate 40 is condensed by the condenser 20. Mercury after striking the substrate and mercury from condenser 20 returns to the hollow-bottom boiler 16 via tube 30. The condenser 20 includes a water inlet 24 and a water outlet 26. To prevent escape of mercury into the environment, the condenser 20 should be designed so that line 28 to the vacuum pump 46, operates at molecular flow conditions. A molecular flow condition is defined in *Scientific Foundations Of Vacuum Science*, second edition, by Saul Dushman, John Wiley & Sons, Inc., 1962. Preferably, a molecular flow condition exists when $\alpha P\mu$ is less than or approximately equal to 5 $\mu$cm ($5 \times 10^{-3}$ Torr cm) where $P\mu$ is the pressure and $\alpha$ is the radius of the line 28 from the condenser 20.

The substrate holder 14 is connected to the shell 12 with an O-ring 35 which seals the shell flange 32 to the substrate holder flange 34. The substrate holder 14 further incorporates a cylindrical water cooled tube 36 which is designed to closely fit into the receiving portion of shell 12. A rectangular water cooled tube 38 protrudes from the water cooled tube 36 and extends to the bottom of the receiving portion 37 in shell 12. Cooling water for the water cooled tubes is circulated by means of inlet 42 and outlet 44.

The substrate 40 must be cooled to a temperature equal to or less than about 40° cooler than the temperature of the mercury vapor jet stream, preferably the substrate temperature should be about 20°–40° C. and most preferably about 20° C. Cooling of the substrate is required to preclude substrate damage and to enhance the dissolution of the mercury-soluble contact as the mercury condenses. As the substrate temperature increases, the rate of condensation and leaching are reduced. The hot mercury vapor condenses on the cooled substrate to dissolve the mercury-soluble metal contained therein, without damaging the substrate. Metals which are soluble in mercury, such as copper, cadmium, zinc, gold, silver, lead, tin, aluminum, iridium, platinum, palladium, and alloys thereof, can be leached from the mercury insoluble substrate. Examples of insoluble materials are, inter alia, glass, sapphire and stainless steel.

A substrate 40 which is to be leached in apparatus 10 is attached to the rectangular water cooled tube 38 by suitable means such as Dow Corning's DC-4 silicon adhesive. The substrate holder 14 is inserted into the shell 12 and positioned therein so that the substrate 40 will be centered in the mercury vapor jet from orifice 18. The substrate material can be any material which is not soluble in mercury, such as glass, fused quartz, silicon, single crystal silicon, polycrystalline silicon amorphous silicon, sapphire, berylium oxide, aluminum oxide, porcelain, steel, nickel, mixtures of magnesium oxide, silica, and/or aluminum oxide and other mercury insoluble alloys or ceramics.

The residual gas pressure of the system is reduced to about $10^{-2}$ Torr or less, with a mechanical or other suitable vacuum pump indicated by 46, before heating the mercury to form a mercury vapor jet and maintained at said pressure during the leaching operation. Residual gas pressure is defined as the total pressure of all gases in the apparatus besides the pressure of the mercury vapor. Maintaining the pressure of the residual gases at low levels is a critical aspect of my invention because at higher pressures, the mercury vapor will form a cloud after passing through the orifice 18 and not form the mercury vapor jet.

High pressure of residual gas can also disrupt the formation of the mercury vapor jet and will allow the mercury vapor to condense on any cool surface within the apparatus rather than being safely and effectively confined to the area around the substrate. The exact pressures of mercury and residual gases are functions of apparatus size and design. Generally, the non-mercury residual gas pressure is inversely related to the distance the mercury vapor jet must travel prior to striking the substrate. The mercury vapor pressure in the jet area should be higher than the residual gas pressure and is defined by the mercury vapor temperature and the specific geometry of the apparatus. An apparatus of sufficient size to leach devices larger than about 3 cm² may require residual gas pressures as low as about $10^{-4}$ to about $10^{-6}$ Torr.

The metal leached from the substrate is either dissolved in the mercury as a solute or a solid suspended in the mercury. The recycling nature of the mercury vapor distillation apparatus permits the rapid leaching of a substantial volume of soluble metals from a large number of substrates with only about 35 cubic centimeters of mercury required in an apparatus designed to handle microelectronic substrates with an area less than about 3 cm². About 15 minutes is a sufficient time to leach metal contacts from the substrate. The skilled artisan will recognize that the time necessary to leach all of the desired metals from the substrate is a function of the substrate composition, metal thickness, the nature of the metal, and the formation parameters of the microelectronic device.

Figure 2:
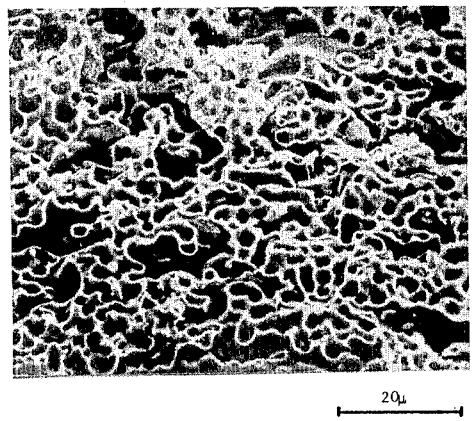
FIG. 2 is a scanning electron micrograph (SEM) of a conductor ink structure fired at 700° C., after mercury vapor leaching (HgVL) of the metal phase according to the invention.
Figure 3:
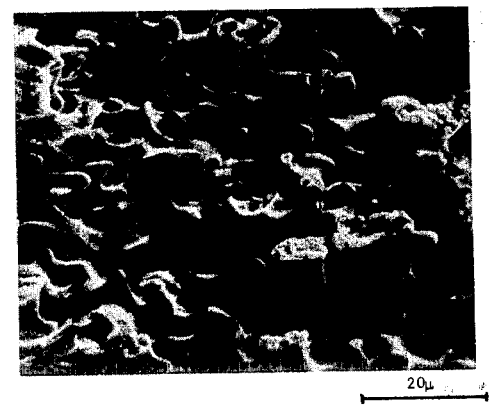
FIG. 3 is an SEM of the same conductor ink pictured in FIG. 2, fired at 1000° C. after HgVL of the metal phase.
Figure 4:
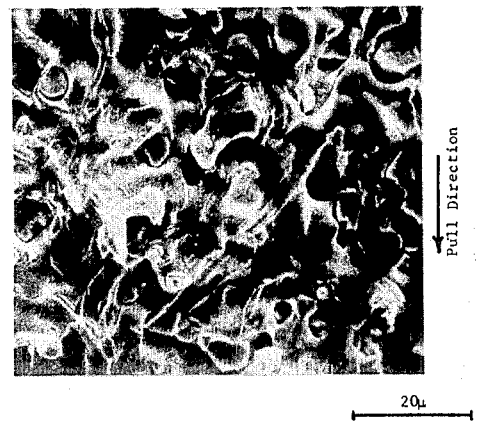
FIG. 4 is an SEM of the same conductor ink as in FIGS. 2 and 3, fired at 950° C., after pulling the metal conductor strip away from the microelectronic substrate.

Turning to FIGS. 2–4, the analytical power of my invention will be clearly illustrated. More specifically, FIG. 2 illustrates the surface of a substrate after the gold has been leached from a fired conducting ink containing gold as the contact metal. The conductor ink was applied to the substrate and fired at 700° C. The firing temperature was not high enough as is apparent to the skilled artisan by the lack of wetting of the substrate.

FIG. 3 illustrates the same conductor ink fired at 1000° C. after the leaching of the gold therefrom. The fibered appearance of the remaining glass indicates a tight adherent bond to the substrate.

FIG. 4 illustrates the same conductor ink fired at 950° C. The fired conductor ink has been puled away from the substrate. The glass fibers pulled away from the substrate with the metal contact. The pulling of the glass fibers indicates an adherent bond created by firing the conductor ink of FIGS. 2 and 3 at a proper temperature.

The ability to remove a metal from a substrate or the metal from a fired conductor ink without damaging the substrate enables the skilled artisan to determine the proper firing temperature of a conductor ink or other metal contact in order to minimize device failure.

It should be understood that various changes, modifications, and variations in the apparatus and process of the present invention may be effected without departing from the spirit and scope of the present invention as defined in the appended claims.

What is claimed is:

1. A method for leaching metals from a substrate without damaging the substrate and contaminating the environment with mercury comprising:

contacting said substrate with a mercury vapor jet at a temperature of at least about 65° C. to about 150° C., said mercury vapor jet having an expansion in width of said jet of less than about 4.0 mm per centimeter of distance traveled, at an angle which is substantially perpendicular with respect to the center of said jet and at a residual gas pressure of less than or equal to about $10^{-2}$ Torr for a time sufficient to dissolve the metal from said substrate.

2. The method according to claim 1 wherein said substrate is a microelectronic device.

3. The method according to claim 1 wherein the substrate temperature is equal to or less than about 40° C. cooler than the temperature of the mercury vapor jet.

4. The method according to claim 1 wherein the residual gas pressure is from about $10^{-4}$ Torr to about $10^{-6}$ Torr.

5. The method according to claim 1 wherein the mercury vapor jet temperature is from about 100° C. to about 125° C.

6. The method according to claim 5 wherein said substrate is cooled to from about 20° C. to about 40° C.

7. The method according to claim 6 wherein the substrate temperature is about 20° C.

8. The method according to claim 1 wherein the mercury vapor jet expands less than about 2.5 mm per centimeter of distance traveled.

9. A method for leaching metals from a substrate comprising:

heating mercury to a temperature sufficient to form a mercury vapor;

passing the mercury vapor through an orifice to form a mercury vapor jet with a temperature of at least about 65° C. to about 150° C. measured just prior to the mercury vapor striking said substrate and an expansion in width of said jet of less than about 4.0 mm per centimeter traveled; and contacting said substrate with said mercury vapor jet, at an angle which is substantially perpendicular with respect to the center of said mercury vapor jet, for a sufficient time to dissolve the mercury soluble metal from said substrate, wherein the substrate temperature is at least about 40° C. cooler than the temperature of the mercury vapor jet and at a residual gas pressure less than or equal to about $10^{-2}$ Torr.

10. The method according to claim 9 further comprising:

collecting, reheating and forming a mercury vapor jet with the mercury which is condensed on said substrate.

* * * * *